(12) United States Patent
Shim et al.

(10) Patent No.: US 9,857,682 B2
(45) Date of Patent: Jan. 2, 2018

(54) POSITIVE PHOTOSENSITIVE SILOXANE RESIN COMPOSITION AND DISPLAY DEVICE FORMED USING THE SAME

(71) Applicant: SAMSUNG DISPLAY CO., LTD., Yongin-si, Gyeonggi-Do (KR)

(72) Inventors: Seung Bo Shim, Asan-si (KR); Jeong Won Kim, Seoul (KR); Jun Hyuk Woo, Seongnam-si (KR); Jin Ho Ju, Seoul (KR); Kwang Woo Park, Hwaseong-si (KR); Byung Uk Kim, Hwaseong-si (KR); Tae-Hoon Yeo, Hwaseong-si (KR); Hyoc-Min Youn, Hwaseong-si (KR); Sang-Hoon Lee, Hwaseong-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 136 days.

(21) Appl. No.: 14/924,301

(22) Filed: Oct. 27, 2015

(65) Prior Publication Data

US 2016/0195810 A1 Jul. 7, 2016

(30) Foreign Application Priority Data

Jan. 5, 2015 (KR) ........................ 10-2015-0000726

(51) Int. Cl.
*G03F 7/038* (2006.01)
*G03F 7/039* (2006.01)
(Continued)

(52) U.S. Cl.
CPC ................ *G03F 7/039* (2013.01); *C08K 5/23* (2013.01); *C08K 5/42* (2013.01); *G03F 7/0233* (2013.01);
(Continued)

(58) Field of Classification Search
None
See application file for complete search history.

(56) References Cited

U.S. PATENT DOCUMENTS

| | | | |
|---|---|---|---|
| 4,510,283 A | * | 4/1985 | Takeda .................... C08G 77/44 524/356 |
| 4,722,881 A | * | 2/1988 | Ueno .................... G03F 7/0757 430/156 |

(Continued)

FOREIGN PATENT DOCUMENTS

| | | |
|---|---|---|
| JP | 2006-245525 A | 9/2006 |
| JP | 2006-317567 A | 11/2006 |

(Continued)

OTHER PUBLICATIONS

Extended European Search Report dated May 4, 2016 in Corresponding European Patent Application No. 15197160.3.

*Primary Examiner* — Robert S Loewe
(74) *Attorney, Agent, or Firm* — Lee & Morse, P.C.

(57) ABSTRACT

A positive photosensitive siloxane resin composition includes a) a siloxane copolymer obtained by performing hydrolysis and condensation polymerization of i) at least one reactive silane represented by the following Chemical Formula 1 and ii) at least one 4-functional reactive silane represented by the following Chemical Formula 2 under a catalyst, the copolymer having a polystyrene-converted weight average molecular weight Mw of 1,000 to 20,000, b) a 1,2-quinonediazide compound, and c) a solvent, $(R_1)_n Si(R_2)_{4-n}$        [Chemical Formula 1]

$Si(R_3)_4$        [Chemical Formula 2]

wherein $R_1$s may each independently be any one of an alkyl group having 1 to 10 carbon atoms and an aryl group having 6 to 15 carbon atoms, $R_2$ may be an alkoxy group having 1

(Continued)

to 4 carbon atoms, phenoxy, or acetoxy, $R_3$s may each independently be any one of an alkoxy group having 1 to 4 carbon atoms, phenoxy, or an acetoxy group, and n may be a natural number of 1 to 3.

21 Claims, 3 Drawing Sheets

(51) Int. Cl.
    *C08K 5/23*     (2006.01)
    *C08K 5/42*     (2006.01)
    *H01L 27/32*     (2006.01)
    *H01L 51/00*     (2006.01)
    *G03F 7/023*     (2006.01)

(52) U.S. Cl.
    CPC .......... *G03F 7/038* (2013.01); *H01L 27/3246* (2013.01); *H01L 27/3248* (2013.01); *H01L 51/0043* (2013.01); *H01L 51/0094* (2013.01)

(56) References Cited

U.S. PATENT DOCUMENTS

| | | | | |
|---|---|---|---|---|
| 5,098,816 A * | 3/1992 | Babich | .................... | G03F 7/027 430/270.1 |
| 5,389,492 A * | 2/1995 | Kokubo | ................. | C08G 77/38 430/165 |
| 5,422,223 A * | 6/1995 | Sachdev | ............. | C08G 77/388 430/166 |
| 5,547,808 A * | 8/1996 | Watanabe | ............. | G03F 7/0757 430/176 |
| 6,270,941 B1 * | 8/2001 | Yasunami | ............... | C08L 83/06 430/270.1 |
| 6,340,735 B1 * | 1/2002 | Yagihashi | ............ | C09D 183/04 528/14 |
| 6,342,562 B1 * | 1/2002 | Kozawa | ................. | C08G 77/02 257/E21.314 |
| 6,797,453 B2 * | 9/2004 | Shiraki | ................. | G03F 7/0007 430/270.1 |
| 7,374,856 B2 * | 5/2008 | Suwa | .................... | G03F 7/0757 430/169 |
| 8,486,604 B2 * | 7/2013 | Hanamura | ............. | C08G 77/12 430/18 |
| 2003/0211407 A1 * | 11/2003 | Watanabe | ........... | C09D 183/06 430/17 |
| 2005/0196699 A1 * | 9/2005 | Kanagasabapathy | .. | C08G 77/58 430/270.1 |
| 2006/0003252 A1 | 1/2006 | Hirayama et al. | | |
| 2010/0102321 A1 | 4/2010 | Abe et al. | | |
| 2011/0008589 A1 * | 1/2011 | Kimura | ................ | C08G 77/045 428/195.1 |
| 2011/0008730 A1 | 1/2011 | Hanamura et al. | | |
| 2012/0178022 A1 | 7/2012 | Kamogawa et al. | | |
| 2012/0237873 A1 * | 9/2012 | Fujiwara | ................ | C08G 77/14 430/280.1 |
| 2013/0216952 A1 * | 8/2013 | Yokoyama | ........... | G03F 7/0757 430/286.1 |
| 2014/0113230 A1 | 4/2014 | Kim et al. | | |
| 2014/0335452 A1 * | 11/2014 | Yokoyama | ........... | G03F 7/0233 430/270.1 |

FOREIGN PATENT DOCUMENTS

| | | |
|---|---|---|
| JP | 4438685 B2 | 3/2010 |
| JP | 4982927 B2 | 7/2012 |
| KR | 10-0740969 B1 | 7/2007 |
| KR | 10-0806191 B1 | 2/2008 |

* cited by examiner

POSITIVE PHOTOSENSITIVE SILOXANE RESIN COMPOSITION AND DISPLAY DEVICE FORMED USING THE SAME

CROSS-REFERENCE TO RELATED APPLICATION

Korean Patent Application No. 10-2015-0000726, filed on Jan. 5, 2015, in the Korean Intellectual Property Office, and entitled: "Positive Photosensitive Siloxane Resin Composition and Display Device Including the Same," is incorporated by reference herein in its entirety.

BACKGROUND

1. Field

Embodiments relate to a positive photosensitive siloxane resin composition and a display device formed using the same.

2. Description of the Related Art

Displays such as liquid crystal displays and organic light emitting displays are commercially attractive. Such displays may include wiring, along with insulation to insulate between wires.

The above information disclosed in this Background section is only for enhancement of understanding of the background of the invention and therefore it may contain information that does not form the prior art that is already known in this country to a person of ordinary skill in the art.

SUMMARY

Embodiments are directed to a positive photosensitive siloxane resin composition, including a) a siloxane copolymer obtained by performing hydrolysis and condensation polymerization of i) at least one reactive silane represented by the following Chemical Formula 1 and ii) at least one 4-functional reactive silane represented by the following Chemical Formula 2 under a catalyst, the copolymer having a polystyrene-converted weight average molecular weight Mw of 1,000 to 20,000, b) a 1,2-quinonediazide compound, and c) a solvent, $(R_1)_n Si(R_2)_{4-n}$     [Chemical Formula 1]

$Si(R_3)_4$     [Chemical Formula 2]

wherein $R_1$s may each independently be any one of an alkyl group having 1 to 10 carbon atoms and an aryl group having 6 to 15 carbon atoms, $R_2$ may be an alkoxy group having 1 to 4 carbon atoms, phenoxy, or acetoxy, $R_3$s may each independently be any one of an alkoxy group having 1 to 4 carbon atoms, phenoxy, or an acetoxy group, and n may be a natural number of 1 to 3.

The copolymer may have an unreacted monomer content of 10% or less and a catalyst content of 2000 ppm or less.

A thermal decomposition temperature Td of the siloxane-based copolymer may be 450° C. or more.

The copolymer may include a ladder structure, and the copolymer having the ladder structure may be present in an amount of 30 wt % or more based on the weight of entire positive photosensitive siloxane resin composition.

The siloxane-based copolymer may be included in an amount of 100 parts by weight, the 1,2-quinonediazide compound may be included in an amount of 5 to 50 parts by weight, and a solid content of the solvent may be 10 to 50 wt %.

The copolymer may be obtained by performing hydrolysis and condensation polymerization of i) 20 to 80 parts by weight of the reactive silane represented by Chemical Formula 1 and ii) 20 to 80 parts by weight of the 4-functional reactive silane represented by Chemical Formula 2.

The copolymer may be obtained by performing hydrolysis and condensation of i) at least one reactive silane represented by Chemical Formula 1, ii) at least one 4-functional reactive silane represented by Chemical Formula 2, and iii) 5 to 50 parts by weight of reactive silane represented by the following Chemical Formula 3:

$(R_1)_n Si(R_5)_{4-n}$     [Chemical Formula 3]

wherein $R_4$s may each independently be vinyl, 3-acryloxyalkyl, 3-methacryloxyalkyl, 1-(p-hydroxyphenyl)alkyl, 2-(p-hydroxyphenyl)alkyl, 3-glycidoxyalkyl, 2-(3,4-epoxycyclohexyl)alkyl, 3-isocyanatealkyl, or oxethanealkyl, $R_5$ may be an alkoxy group having 1 to 4 carbon atoms, phenoxy, or acetoxy, and n may be a natural number of 1 to 3.

The 1,2-quinonediazide compound may include at least one of 1,2-quinonediazide 4-sulfonic acid ester, 1,2-quinonediazide 5-sulfonic acid ester, and 1,2-quinonediazide 6-sulfonic acid ester.

The solvent may include at least one of propyleneglycolmethylether acetate, propyleneglycolethylether acetate, propyleneglycolpropylether acetate, propyleneglycolmethylether propionate, propyleneglycolethylether propionate, propyleneglycolpropylether propionate, propyleneglycolmethylether, propyleneglycolethylether, propyleneglycolpropylether, propyleneglycolbutylether, diethyleneglycoldiethylether, diethyleneglycolmethylethylether, dipropyleneglycoldimethylether, dibutyleneglycoldimethylether, dibutyleneglycoldiethylether, diethyleneglycolbutylmethylether, diethyleneglycolbutylethylether, triethyleneglycoldimethylether, triethyleneglycolbutylmethylether, diethyleneglycoltertiarybutylether, tetraethyleneglycoldimethylether, dipropyleneglycoldiethylether, diethyleneglycolethylhexylether, diethyleneglycolmethylhexylether, dipropyleneglycolbutylmethylether, dipropyleneglycolethylhexylether, and dipropyleneglycolmethylhexylether.

The positive photosensitive siloxane resin composition may further include d) 1 to 20 parts by weight of a silane coupling agent represented by the following Chemical Formula 4:

$(R_6)_n Si(R_7)_{4-n}$     [Chemical Formula 4]

$R_6$s may each independently be 1-(p-hydroxyphenyl)alkyl, 2-(p-hydroxyphenyl)alkyl, 3-glycidoxyalkyl, 2-(3,4-epoxycyclohexyl)alkyl, 3-oxethanealkyl, or 3-isocyanatealkyl, $R_7$ may be an alkoxy group having 1 to 4 carbon atoms, phenoxy, or acetoxy, and n may be a natural number of 1 to 3.

Embodiments are also directed to a method of manufacturing a positive photosensitive siloxane resin composition, the method including forming a) a siloxane copolymer by performing hydrolysis and condensation polymerization of i) at least one reactive silane represented by the following Chemical Formula 1 and ii) at least one 4-functional reactive silane represented by the following Chemical Formula 2 under a catalyst, and performing filtering to remove an unreacted monomer and the catalyst with respect to the copolymer, wherein a polystyrene-converted weight average molecular weight Mw of the copolymer is 1,000 to 20,000, and combining the a) copolymer with b) a 1,2-quinonediazide compound, and c) a solvent, $(R_1)_n Si(R_2)_{4-n}$     [Chemical Formula 1]

$Si(R_3)_4$     [Chemical Formula 2]

wherein $R_1$s may each independently be any one of an alkyl group having 1 to 10 carbon atoms and an aryl group having 6 to 15 carbon atoms, $R_2$ may be an alkoxy group having 1 to 4 carbon atoms, phenoxy, or acetoxy, $R_3$s may each independently be any one of an alkoxy group having 1 to 4 carbon atoms, phenoxy, or an acetoxy group, and n may be a natural number of 1 to 3.

The filtering may be repeated so that an unreacted monomer content is 10% or less and a catalyst content is 2000 ppm or less.

A thermal decomposition temperature Td of the copolymer may be 450° C. or more.

The copolymer may include a ladder structure, and the copolymer having the ladder structure may be present in an amount of 30 wt % or more based on the entire positive photosensitive siloxane resin composition.

The copolymer may be included in an amount of 100 parts by weight, the 1,2-quinonediazide compound may be included in an amount of 5 to 50 parts by weight, and a solid content of the solvent may be 10 to 50 wt %.

The copolymer may be obtained by performing hydrolysis and condensation polymerization of i) 20 to 80 parts by weight of the reactive silane represented by Chemical Formula 1 and ii) 20 to 80 parts by weight of the 4-functional reactive silane represented by Chemical Formula 2.

The copolymer may be obtained by performing hydrolysis and condensation of i) at least one reactive silane represented by Chemical Formula 1, ii) at least one 4-functional reactive silane represented by Chemical Formula 2, and iii) 5 to 50 parts by weight of reactive silane represented by the following Chemical Formula 3:

$$(R_4)_n Si(R_5)_{4-n}$$ [Chemical Formula 3]

wherein $R_4$s may each independently be vinyl, 3-acryloxyalkyl, 3-methacryloxyalkyl, 1-(p-hydroxyphenyl)alkyl, 2-(p-hydroxyphenyl)alkyl, 3-glycidoxyalkyl, 2-(3,4-epoxycyclohexyl)alkyl, 3-isocyanatealkyl, or oxethanealkyl, $R_5$ may be an alkoxy group having 1 to 4 carbon atoms, phenoxy, or acetoxy, and n may be a natural number of 1 to 3.

The a) copolymer with b) a 1,2-quinonediazide compound, and c) a solvent may be combined with d) 1 to 20 parts by weight of a silane coupling agent represented by the following Chemical Formula 4:

$$(R_6)_n Si(R_7)_{4-n}$$ [Chemical Formula 4]

wherein $R_6$s may each independently be 1-(p-hydroxyphenyl)alkyl, 2-(p-hydroxyphenyl)alkyl, 3-glycidoxyalkyl, 2-(3,4-epoxycyclohexyl)alkyl, 3-oxethanealkyl, or 3-isocyanatealkyl, $R_7$ may be an alkoxy group having 1 to 4 carbon atoms, phenoxy, or acetoxy, and n may be a natural number of 1 to 3.

Embodiments are also directed to an organic light emitting display, including an insulating substrate, a thin film transistor positioned on the insulating substrate, a first electrode connected to the thin film transistor, a pixel definition layer positioned on the first electrode and partially exposing the first electrode, an organic emission layer positioned on the pixel definition layer, and a second electrode positioned on the organic emission layer. The pixel definition layer may be formed from a composition that includes a) a siloxane copolymer obtained by performing hydrolysis and condensation polymerization of i) at least one reactive silane represented by the following Chemical Formula 1 and ii) at least one 4-functional reactive silane represented by the following Chemical Formula 2 under a catalyst, the copolymer having a polystyrene-converted weight average molecular weight Mw of 1,000 to 20,000;
b) a 1,2-quinonediazide compound; and
c) a solvent, $$(R_1)_n Si(R_2)_{4-n}$$ [Chemical Formula 1]

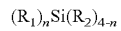

$$Si(R_3)_4$$ [Chemical Formula 2]

wherein $R_1$s may each independently be any one of an alkyl group having 1 to 10 carbon atoms and an aryl group having 6 to 15 carbon atoms, $R_2$ may be an alkoxy group having 1 to 4 carbon atoms, phenoxy, or acetoxy, $R_3$s may each independently be any one of an alkoxy group having 1 to 4 carbon atoms, phenoxy, or an acetoxy group, and n may be a natural number of 1 to 3.

The copolymer may have an unreacted monomer content of 10% or less and a catalyst content of 2000 ppm or less.

In the composition, the copolymer may be included in an amount of 100 parts by weight, the 1,2-quinonediazide compound may be included in an amount of 5 to 50 parts by weight, and a solid content of the solvent may be 10 to 50 wt %.

The siloxane-based copolymer may be obtained by performing hydrolysis and condensation polymerization of i) 20 to 80 parts by weight of the reactive silane represented by Chemical Formula 1 and ii) 20 to 80 parts by weight of the 4-functional reactive silane represented by Chemical Formula 2.

The copolymer may be obtained by performing hydrolysis and condensation of i) at least one reactive silane represented by Chemical Formula 1, ii) at least one 4-functional reactive silane represented by Chemical Formula 2, and iii) 5 to 50 parts by weight of reactive silane represented by the following Chemical Formula 3:

$$(R_4)_n Si(R_5)_{4-n}$$ [Chemical Formula 3]

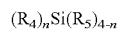

wherein $R_4$s may each independently be vinyl, 3-acryloxyalkyl, 3-methacryloxyalkyl, 1-(p-hydroxyphenyl)alkyl, 2-(p-hydroxyphenyl)alkyl, 3-glycidoxyalkyl, 2-(3,4-epoxycyclohexyl)alkyl, 3-isocyanatealkyl, or oxethanealkyl, $R_5$ may be an alkoxy group having 1 to 4 carbon atoms, phenoxy, or acetoxy, and n may be a natural number of 1 to 3.

The composition may further include d) 1 to 20 parts by weight of a silane coupling agent represented by the following Chemical Formula 4:

$$(R_6)_n Si(R_7)_{4-n}$$ [Chemical Formula 4]

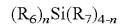

wherein $R_6$s may each independently be 1-(p-hydroxyphenyl)alkyl, 2-(p-hydroxyphenyl)alkyl, 3-glycidoxyalkyl, 2-(3,4-epoxycyclohexyl)alkyl, 3-oxethanealkyl, or 3-isocyanatealkyl, $R_7$ may be an alkoxy group having 1 to 4 carbon atoms, phenoxy, or acetoxy, and n may be a natural number of 1 to 3.

BRIEF DESCRIPTION OF THE DRAWINGS

Features will become apparent to those of skill in the art by describing in detail example embodiments with reference to the attached drawings in which.

<Description of symbols>

Figure 1:
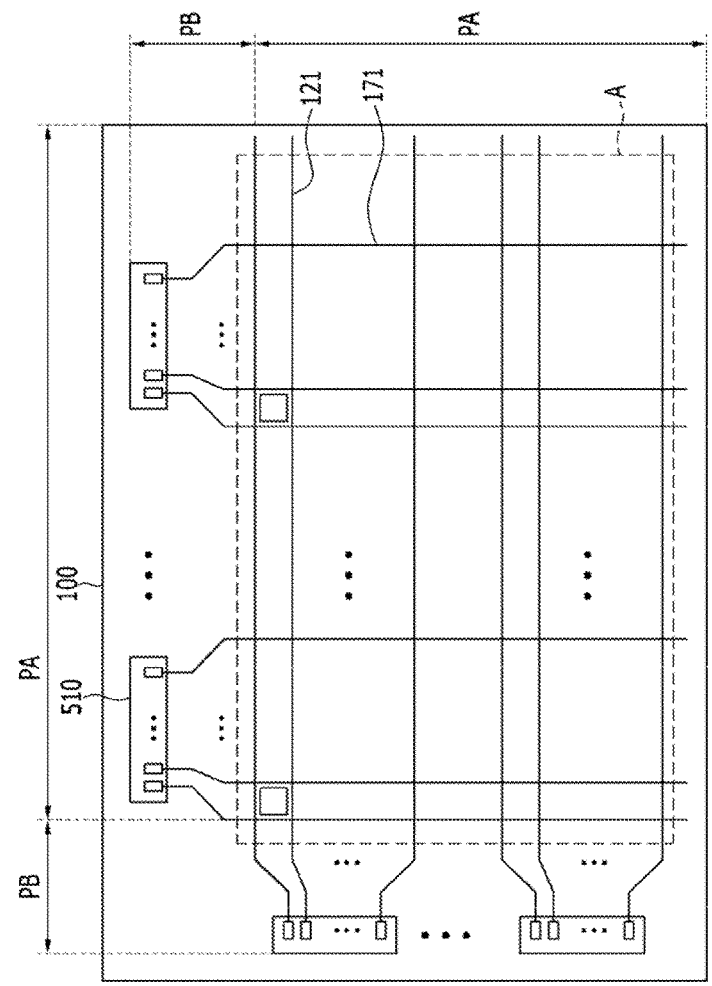
FIG. 1 illustrates a layout view of a signal line of a display unit of an organic light emitting display according to an example embodiment.

100: Flexible substrate
121: First signal line
1355: Channel region
140: Gate insulating layer
160: Interlayer insulating layer
172: Third signal line
177: Drain electrode
200: First display unit
510: Driver
120: Buffer layer
135: Semiconductor
1356: Drain region
155: Gate electrode
171: Second signal line
176: Source electrode
180: Interlayer insulating layer
260: Sealing member
1000: Display device

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, hereinafter, a positive photosensitive siloxane resin composition according to an example embodiment will be described.

The positive photosensitive siloxane resin composition according to the present example embodiment may include a) a siloxane-based copolymer obtained by performing hydrolysis and condensation polymerization of i) one kind or more of reactive silane represented by the following Chemical Formula 1 and ii) one kind or more of 4-functional reactive silane represented by the following Chemical Formula 2 under a catalyst, and then removing an unreacted monomer and the catalyst, the copolymer having a polystyrene-converted weight average molecular weight Mw of 1,000 to 20,000; b) a 1,2-quinonediazide compound; and c) a solvent.

$(R_1)_n Si(R_2)_{4-n}$ [Chemical Formula 1]

$Si(R_3)_4$ [Chemical Formula 2]

wherein $R_1$s are each independently any one of an alkyl group having 1 to 10 carbon atoms and an aryl group having 6 to 15 carbon atoms, $R_2$s are each independently an alkoxy group having 1 to 4 carbon atoms, phenoxy, or acetoxy, $R_3$s are each independently any one of an alkoxy group having 1 to 4 carbon atoms, phenoxy, or an acetoxy group, and n is a natural number of 1 to 3.

The positive photosensitive siloxane resin composition may include a) 100 parts by weight of the siloxane-based copolymer, b) 5 to 50 parts by weight of the 1,2-quinonediazide compound, and c) the solvent having a solid content of 10 to 50 wt %.

The siloxane-based copolymer of a) used in the present example embodiment may have excellent performance such as sensitivity, resolution, adherence, transmittance, and a heat resisting discoloration property, and suppress outgassing and reduce moisture absorptivity due to improved heat resistance, and thus improve reliability of a display device.

a) i) Reactive silane represented by Chemical Formula 1 according to the example embodiment may be, for example, phenyltrimethoxysilane, phenyltriethoxysilane, phenyltributoxysilane, phenylmethyldimethoxysilane, phenyltriacetoxysilane, phenyltriphenoxysilane, diphenyldimethoxysilane, diphenyldiethoxysilane, diphenyldiphenoxysilane, triphenylmethoxysilane, triphenylethoxysilane, methyltrimethoxysilane, ethyltrimethoxysilane, butyltrimethoxysilane, hexyltrimethoxysilane, methyltriethoxysilane, or dimethyldimethoxysilane, and may be used alone or used such that two kinds or more thereof are mixed.

a) i) Reactive silane represented by Chemical Formula 1 may be included in an amount of 20 to 80 parts by weight based on entire monomers. Maintaining the amount at 20 parts by weight or more may help avoid formation of cracks, and maintaining the amount at 80 parts by weight or less may help avoid reduction in reactivity during polymerization, which could make control of a molecular weight difficult.

a) ii) 4-functional reactive silane represented by Chemical Formula 2 used in the present example embodiment may be, for example, tetramethoxysilane, tetraethoxysilane, tetrabutoxysilane, tetraphenoxysilane, or tetraacetoxysilane, and may be used alone or used such that two kinds or more thereof are mixed.

a) ii) 4-functional reactive silane represented by Chemical Formula 2 may be included in an amount of 20 to 80 parts by weight based on entire monomers. Maintaining the amount at 20 parts by weight or more may help maintain solubility to an alkali aqueous solution when a pattern of the photosensitive siloxane resin composition is formed, and maintaining the amount at 80 parts by weight or less may help avoid unduly high reactivity during polymerization, which may make control of the molecular weight difficult, may help avoid excessive solubility of a generated siloxane oligomer to the alkali aqueous solution.

Further, forming a) the siloxane-based copolymer according to the example embodiment may further include including iii) a reactive silane represented by the following Chemical Formula 3; the copolymer may be obtained by performing hydrolysis and condensation polymerization under the catalyst and removing the unreacted monomer and the catalyst.

$(R_1)_n Si(R_2)_{4-n}$ [Chemical Formula 3]

wherein $R_4$s are each independently vinyl, 3-acryloxyalkyl, 3-methacryloxyalkyl, 1-(p-hydroxyphenyl)alkyl, 2-(p-hydroxyphenyl)alkyl, 3-glycidoxyalkyl, 2-(3,4-epoxycyclohexyl)alkyl, 3-isocyanatealkyl, or oxethanealkyl, $R_5$ is an alkoxy group having 1 to 4 carbon atoms, phenoxy, or acetoxy, and n is a natural number of 1 to 3.

For example, iii) reactive silane represented by Chemical Formula 3 may be 3-acryloxypropyltrimethoxysilane, 3-acryloxypropyltriethoxysilane, 3-methacryloxypropyltriethoxysilane, 1-(p-hydroxy phenyl)ethyltrimethoxysilane, 2-(p-hydroxy phenyl)ethyltriethoxysilane, 3-glycidoxypropyltrimethoxysilane, 3-glycidoxypropyltriethoxysilane, 3-glycidoxypropylmethyldimethoxysilane, 2-(3,4-epoxy cyclohexyl)ethyltrimethoxysilane, 2-(3,4-epoxy cyclohexyl) ethylmethyldimethoxysilane, 3-isocyanatepropyltriethoxysilane, 3-isocyanatepropyltrimethoxysilane, and oxethaneethyltrimethoxysilane, and may be used alone or used such that two kinds or more thereof are mixed.

In the case where iii) reactive silane represented by Chemical Formula 3 or a mixture thereof is used, a use amount may be 5 to 50 parts by weight of entire silane monomers. This is because in the case where the use amount is within the aforementioned range, adherence and the degree of layer curing may be excellent.

An oligomer siloxane compound of a) used in the positive photosensitive siloxane resin composition may be obtained by performing bulk polymerization or solution polymerization of reactive silane and the like under water and an acid or base catalyst, and obtained through a process of performing hydrolysis and condensation polymerization and removing the unreacted monomer and the catalyst.

The acid catalyst that may be used in the aforementioned polymerization may be, for example, hydrochloric acid, nitric acid, sulfuric acid, oxalic acid, formic acid, acetic acid, propionic acid, a butanoic acid, or pentanoic acid, the base catalyst may be, for example, ammonia, an organic amine, or an alkylammonium hydroxide salt, and the catalysts may be used alone or two kinds or more thereof may be mixed to be simultaneously or used in gradations.

As a result of analysis of a) the finally obtained siloxane-based copolymer by using gel permeation chromatography (GPC), a polystyrene-converted weight average molecular weight Mw may be 1,000 to 20,000.

Maintaining the polystyrene-converted weight average molecular weight Mw at 1,000 or more may help maintain heat resistance and moisture absorptivity characteristics, and improve a layer remaining rate during a developing process. Maintaining the polystyrene-converted weight average molecular weight Mw at 20,000 or less may help maintain sensitivity of the positive photosensitive siloxane resin composition and enhance a developing property of the pattern.

Further, the positive photosensitive siloxane resin insulating layer composition may include b) the 1,2-quinonediazide compound, and b) the 1,2-quinonediazide compound according to the example embodiment may be a photosensitive compound.

For example, the 1,2-quinonediazide compound may be 1,2-quinonediazide 4-sulfonic acid ester, 1,2-quinonediazide 5-sulfonic acid ester, or 1,2-quinonediazide 6-sulfonic acid ester. For example, b) the 1,2-quinonediazide compound may be a compound obtained by reacting a phenol compound and a naphthoquinonediazide sulfonic acid halogen compound. For example, the quinonediazide compound may be a compound obtained by reacting the naphthoquinonediazide sulfonic acid halogen compound, one of the phenol compounds represented by the following Chemical Formula 5, and the like under a weak base. In this case, the phenol compounds may be used alone or used such that two kinds or more thereof are mixed.

[Chemical Formula 5]

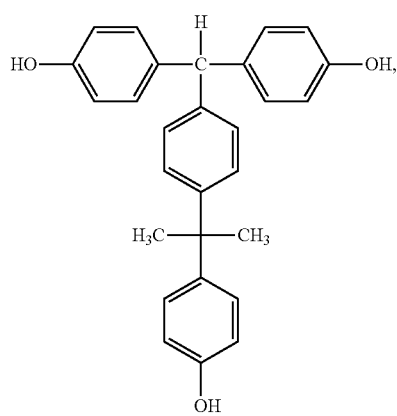

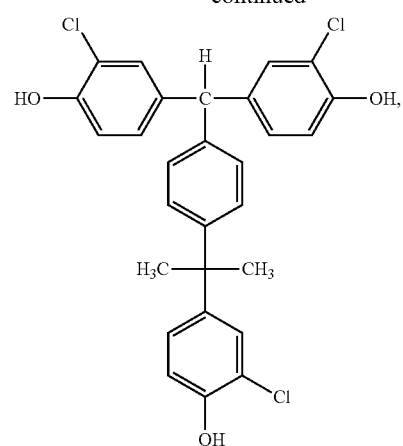

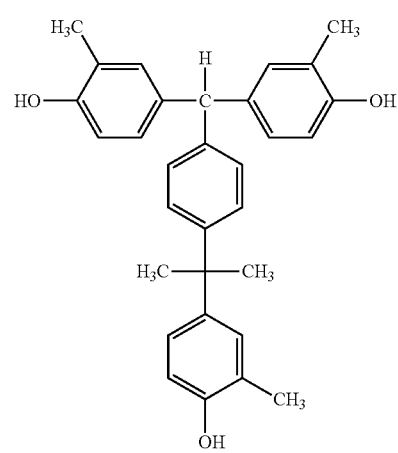

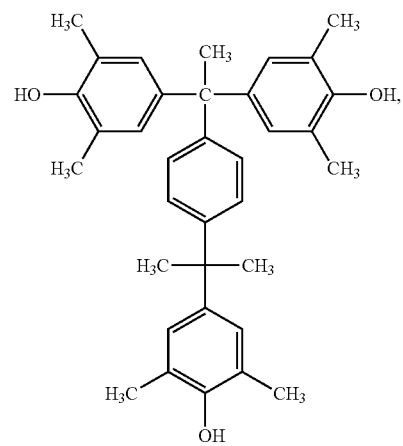

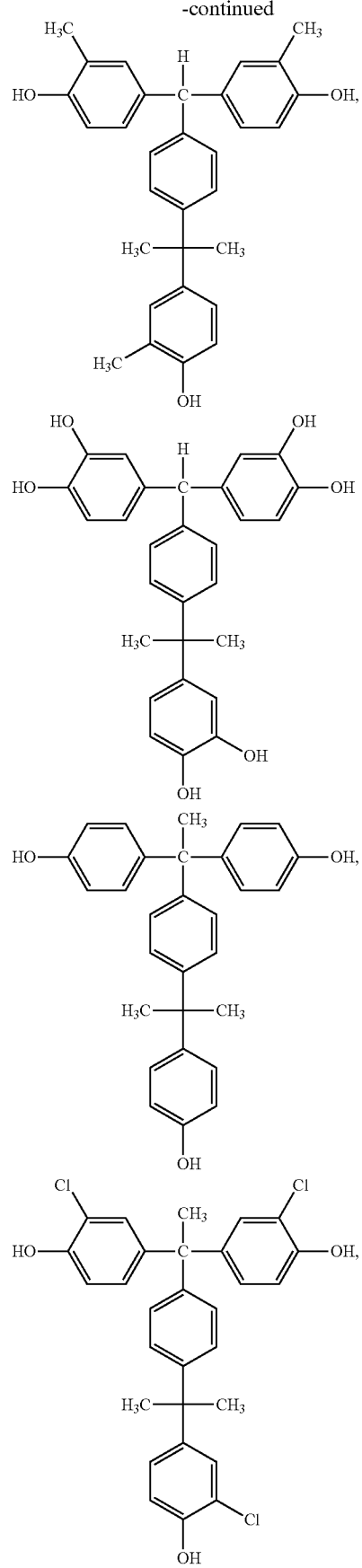
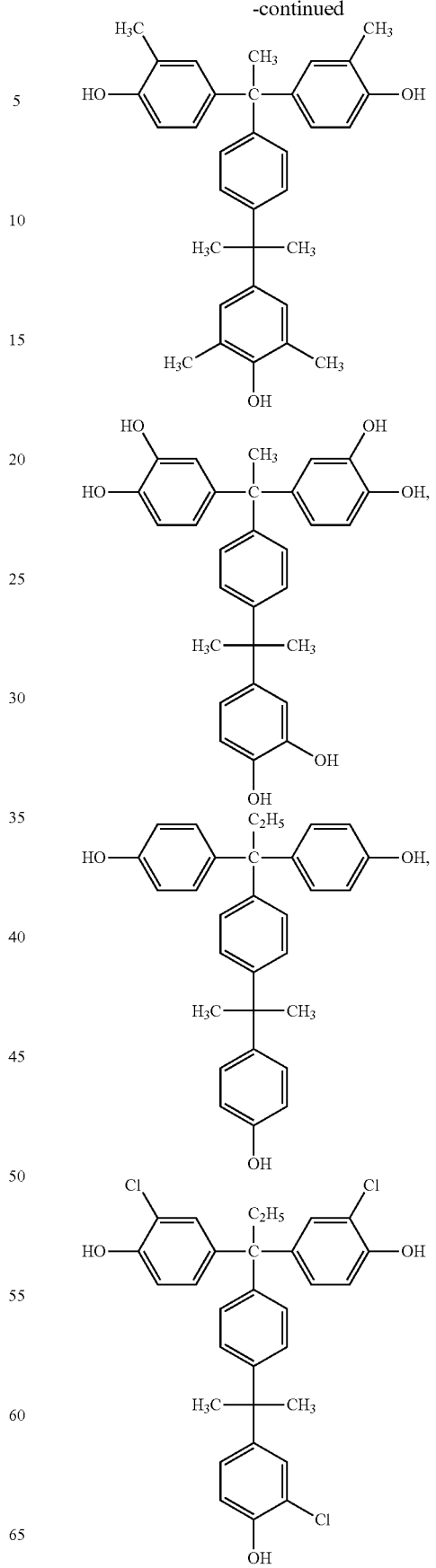

-continued
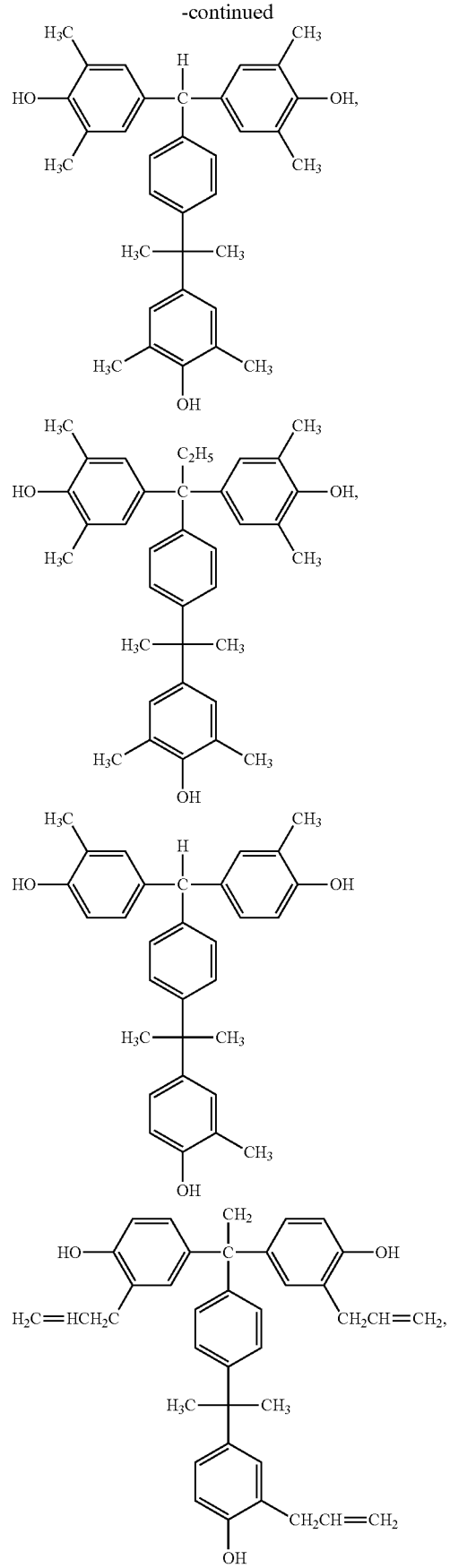
-continued
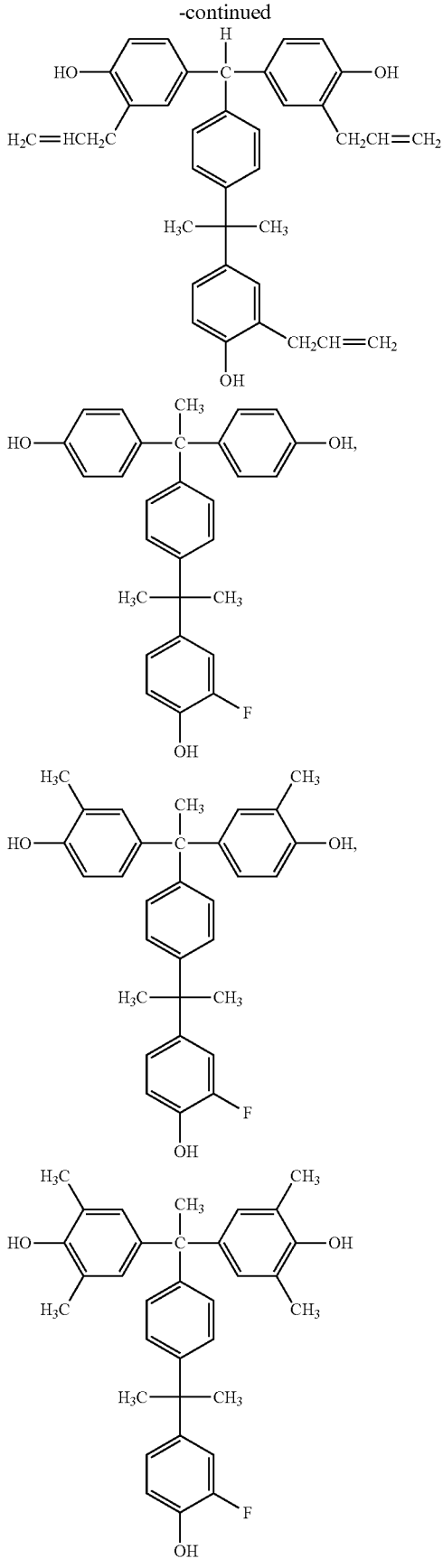

When the quinonediazide compound is synthesized by the phenol compound and the naphthoquinonediazide sulfonic acid halogen compound, the degree of esterification may be about 50 to 85%. Maintaining the degree of esterification at 50% or more may avoid reductions in a layer remaining rate, and maintaining the degree of esterification at 85% or less may help ensure storage stability.

b) The 1,2-quinonediazide compound may be included in an amount of 5 to 50 parts by weight based on 100 parts by weight of a) the siloxane-based copolymer. Maintaining the amount at 5 parts by weight or more may help form a pattern by avoiding reductions in solubility between an exposed portion and a non-exposed portion. Maintaining the amount at 50 parts by weight or less may ensure developing when light is radiated within a short time by reducing a remaining amount of unreacted 1,2-quinonediazide compound, which could excessively reduce solubility to an alkali aqueous solution that is a developing solution.

Further, the positive photosensitive siloxane resin composition includes c) the solvent, and c) the solvent prevents flatness and coating stains of the positive photosensitive siloxane resin composition from occurring to form a uniform pattern profile.

Examples of c) the solvent may be propyleneglycolmethylether acetate, propyleneglycolethylether acetate, propyleneglycolpropylether acetate, propyleneglycolmethylether propionate, propyleneglycolethylether propionate, propyleneglycolpropylether propionate, propyleneglycolmethylether, propyleneglycolethylether, propyleneglycolpropylether, propyleneglycolbutylether, diethyleneglycoldiethylether, diethyleneglycolmethylethylether, dipropyleneglycoldimethylether, dibutyleneglycoldimethylether, dibutyleneglycoldiethylether, diethyleneglycolbutylmethylether, diethyleneglycolbutylethylether, triethyleneglycoldimethylether, triethyleneglycolbutylmethylether, diethyleneglycoltertiarybutylether, tetraethyleneglycoldimethylether, dipropyleneglycoldiethylether, diethyleneglycolethylhexylether, diethyleneglycolmethylhexylether, dipropyleneglycolbutylmethylether, dipropyleneglycolethylhexylether, and dipropyleneglycolmethylhexylether, and may be used alone or used such that two kinds or more thereof are mixed.

c) The solvent may be included so that a solid content of the positive photosensitive siloxane resin composition is 10 to 50 wt %. Maintaining the amount of the solid content at 10 wt % or more may help ensure a sufficient coating thickness and provide uniformity. Maintaining the solid content at 50 wt % or less may help avoid an undue increase in coating thickness and ease the use of coating equipment during coating. In the case where the solid content of the entire composition is 10 to 25 wt %, a slit coater may be used, and in the case where the solid content is 25 to 50 wt %, a spin coater or slit and spin coaters may be used.

The positive photosensitive siloxane resin composition having the aforementioned component may further include d) a silane coupling agent represented by the following Chemical Formula 4.

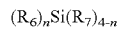　　　　　　　　　　　　[Chemical Formula 4]

wherein $R_6$s are each independently 1-(p-hydroxyphenyl)alkyl, 2-(p-hydroxyphenyl)alkyl, 3-glycidoxyalkyl, 2-(3,4-epoxycyclohexyl)alkyl, 3-oxethanealkyl, or 3-isocyanatealkyl, $R_7$ is an alkoxy group having 1 to 4 carbon atoms, phenoxy, or acetoxy, and n is a natural number of 1 to 3.

The positive photosensitive siloxane resin composition may be filtered by a millipore filter having a size of 0.1 to 0.2 μm and the like to have a solid concentration of 10 to 50 wt %, and then used.

The positive photosensitive siloxane resin composition may have excellent physical properties such as sensitivity, resolution, adherence, transmittance, and a heat resisting discoloration property, and particularly, may suppress outgassing and have low moisture absorptivity through excellent heat resistance.

Hereinafter, an organic light emitting display including the positive photosensitive siloxane resin composition will be described. FIG. 1 is a layout view of a signal line of a display unit of the organic light emitting display according to the example embodiment, FIG. 2 is an equivalent circuit diagram of one pixel of the display unit according to the example embodiment, and FIG. 3 is a cross-sectional view of one pixel of the organic light emitting display of FIG. 2.

Referring to FIG. 1, a first signal line 121 extending in one direction to transfer a scan signal, and a second signal line 171 crossing the first signal line 121 to transfer an image signal are formed on a first display region LA of a substrate 100. The first signal line and the second signal line are connected to each pixel, and the pixel may be connected to various signal lines (not illustrated), to which the other signal is applied, other than the first signal line and the second signal line.

A driver 510 positioned in a peripheral region PB outside the first display region LA and controlling a thin film transistor of the pixel is positioned on the substrate 100. The driver 510 may be mounted as an IC chip on the substrate 100, or may be integrated together with the thin film transistors of the first display region LA on the substrate.

Figure 2:
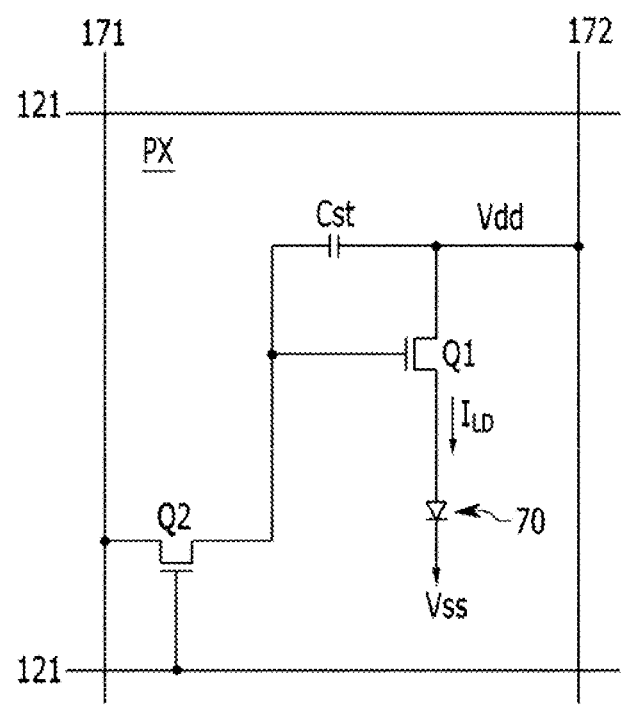
FIG. 2 illustrates an equivalent circuit diagram of one pixel of the display unit according to the example embodiment.
Figure 3:
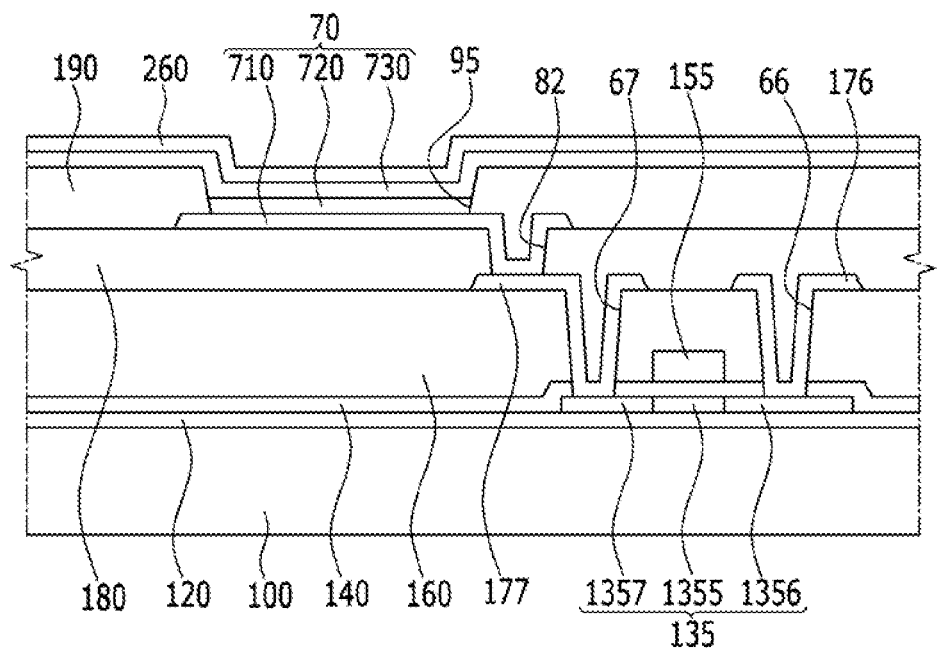
FIG. 3 illustrates a cross-sectional view of one pixel of the organic light emitting display of FIG. 2.

Meanwhile, the organic light emitting display according to the example embodiment includes a plurality of pixels each including the same equivalent circuit as FIG. 2.

Referring to FIG. 2, the organic light emitting display according to the example embodiment includes the plurality of signal lines 121 and 171, and the plurality of pixels PX connected thereto and arranged in an approximate matrix form.

The signal lines include a plurality of first signal lines 121 transferring a gate signal (or a scan signal), a plurality of second signal lines 171 transferring a data signal, and a plurality of third signal lines 172 transferring a driving voltage Vdd. The first signal lines 121 extend in an approximate row direction and are almost parallel to each other, and the second signal lines 171 and the third signal lines 172 cross the first signal lines 121 to extend in a column direction and are almost parallel to each other.

Each pixel PX includes a switching thin film transistor Q2, a driving thin film transistor Q1, a storage capacitor Cst, and an organic light emitting diode (OLED) 70.

The switching thin film transistor Q2 has a control terminal, an input terminal, and an output terminal, the control terminal is connected to the first signal line 121, the input terminal is connected to the second signal line 171, and the output terminal is connected to the driving thin film transistor Q1. The switching thin film transistor Q2 responds to the scan signal applied to the first signal line 121 to transfer the data signal applied to the second signal line 171 to the driving thin film transistor Q1.

The driving thin film transistor Q1 also has a control terminal, an input terminal, and an output terminal, the control terminal is connected to the switching thin film transistor Q2, the input terminal is connected to the third signal line 172, and the output terminal is connected to an organic light emitting element 70. The driving thin film transistor Q1 allows an output current $I_{LD}$ having a magnitude varying according to a voltage applied between the control terminal and the output terminal to flow.

The capacitor Cst is connected to the control terminal and the input terminal of the driving thin film transistor Q1. The capacitor Cst charges the data signal applied to the control terminal of the driving thin film transistor Q1 and maintains the data signal even after the switching thin film transistor Q2 is turned-off.

The organic light emitting element 70 has an anode connected to the output terminal of the driving thin film transistor Q1, and a cathode connected to a common voltage Vss. The organic light emitting element 70 displays an image by emitting light while changing the intensity according to the output current $I_{LD}$ of the driving thin film transistor Q1.

FIG. 3 is a cross-sectional view of one pixel of the organic light emitting display of FIG. 2. In FIG. 3, a second thin film transistor Q2 and the organic light emitting element 70 of FIG. 2 will be mainly described in detail according to the order of lamination. Hereinafter, the second thin film transistor Q2 will be called a thin film transistor.

As illustrated in FIG. 3, the organic light emitting display includes the substrate 100, and a buffer layer 120 is positioned on the substrate 100.

The buffer layer 120 may be formed to have a single layer structure of silicon nitride ($SiN_x$) or a dual-layer structure in which silicon nitride ($SiN_x$) and silicon oxide ($SiO_2$) are laminated. The buffer layer 120 serves to prevent unnecessary components such as an impurity or moisture from permeating and planarize a surface.

A semiconductor 135 formed of polysilicon is positioned on the buffer layer 120.

The semiconductor 135 includes a channel region 1355, and a source region 1356 and a drain region 1357 formed at both sides of the channel region 1355. The channel region 1355 of the semiconductor is polysilicon not doped with the impurity, that is, an intrinsic semiconductor. The source region 1356 and the drain region 1357 are polysilicon doped with a conductive impurity, that is, an impurity semiconductor. The impurity doped on the source region 1356 and the drain region 1357 may be any one of a p-type impurity and an n-type impurity.

A gate insulating layer 140 is formed on the semiconductor 135. The gate insulating layer 140 may be a single layer or a plurality of layers including at least one of tetraethoxysilane (tetraethyl orthosilicate, TEOS), silicon nitride, silicon oxide, and the aforementioned positive photosensitive siloxane resin composition.

A gate electrode 155 is positioned on the semiconductor 135, and the gate electrode 155 overlaps with the channel region 1355.

The gate electrode 155 may be formed of a single layer or a plurality of layers of a low resistance material such as Al, Ti, Mo, Cu, Ni, or an alloy thereof, or a material having strong corrosion.

A first interlayer insulating layer 160 is formed on the gate electrode 155. A material of the first interlayer insulating layer 160 may be, like the gate insulating layer 140, tetraethoxysilane (tetraethyl orthosilicate, TEOS), silicon nitride, silicon oxide, or the aforementioned positive photosensitive siloxane resin composition, and the first interlayer insulating layer may be formed of a single layer or a plurality of layers.

In the first interlayer insulating layer 160 and the gate insulating layer 140, a source contact hole 66 and a drain contact hole 67 through which the source region 1356 and the drain region 1357 are exposed, respectively, are formed.

A source electrode 176 and a drain electrode 177 are positioned on the first interlayer insulating layer 160. The source electrode 176 is connected to the source region 1356 through the contact hole 66, and the drain electrode 177 is connected to the drain region 1357 through the contact hole 67.

The source electrode 176 and the drain electrode 177 may be formed of a single layer or a plurality of layers of a low resistance material such as Al, Ti, Mo, Cu, Ni, or an alloy thereof, or a material having strong resistance to corrosion. For example, the source electrode and the drain electrode may be a triple layer of Ti/Cu/Ti, Ti/Ag/Ti, or Mo/Al/Mo.

The gate electrode 155, the source electrode 176, and the drain electrode 177 are a control electrode, an input electrode, and an output electrode of FIG. 2, respectively, and form a thin film transistor together with the semiconductor 135. A channel of the thin film transistor is formed in the semiconductor 135 between the source electrode 176 and the drain electrode 177.

A second interlayer insulating layer 180 is positioned on the source electrode 176 and the drain electrode 177. The second interlayer insulating layer 180 includes a contact hole 82 through which the drain electrode 177 is exposed.

A material of the second interlayer insulating layer 180 may be, like the first interlayer insulating layer, tetraethoxysilane (tetraethyl orthosilicate, TEOS), silicon nitride, silicon oxide, or the aforementioned positive photosensitive siloxane resin composition, and the second interlayer insulating layer may be formed of a single layer or a plurality of layers.

A first electrode 710 is positioned on the second interlayer insulating layer 180. The first electrode 710 is electrically connected to the drain electrode 177 through the contact hole 82, and the first electrode 710 may be an anode of the organic light emitting element of FIG. 2.

In one example embodiment, the interlayer insulating layer is formed between the first electrode 710 and the drain electrode 177, but the first electrode 710 may be formed on the same layer as the drain electrode 177 and may be integrated with the drain electrode 177.

A pixel definition layer 190 is positioned on the first electrode 710. The pixel definition layer 190 has an opening 95 through which the first electrode 710 is exposed. The pixel definition layer 190 may be formed to include polyacrylates, polyimides, or the aforementioned positive photosensitive siloxane resin composition, silica-based inorganic materials, and the like.

An organic emission layer 720 is positioned in the opening 95 of the pixel definition layer 190.

The organic emission layer 720 is formed of multilayers including one or more of an emission layer, a hole injection layer (HIL), a hole transporting layer (HTL), an electron transporting layer (ETL), and an electron injection layer (EIL).

In the case where the organic emission layer 720 includes all of the layers, the hole injection layer may be positioned on the first electrode 710 that is the anode, and the hole transporting layer, the emission layer, the electron transporting layer, and the electron injection layer may be sequentially laminated thereon.

In this case, the emission layer may be formed of a low molecular weight organic material or a high molecular weight organic material such as PEDOT (poly 3,4-ethylenedioxythiophene). The emission layer may include a red emission layer emitting red light, a green emission layer emitting green light, and a blue emission layer emitting blue light, and the red emission layer, the green emission layer, and the blue emission layer are respectively formed in a red pixel, a green pixel, and a blue pixel to implement a color image.

Further, the emission layer may implement the color image by laminating all of the red emission layer, the green emission layer, and the blue emission layer in the red pixel, the green pixel, and the blue pixel together, and forming a red color filter, a green color filter, and a blue color filter for each pixel. In another example, a white emission layer emitting white light may be formed in all of the red pixel, the green pixel, and the blue pixel, and the red color filter, the green color filter, and the blue color filter may be formed for each pixel to implement the color image. In the case where the color image is implemented using the white emission layer and the color filter, deposition masks for depositing the red emission layer, the green emission layer, and the emission layer on each pixel, that is, the red pixel, the green pixel, and the blue pixel may not be used.

Further, the white emission layer may be formed of one emission layer emitting white light, or may emit white light by laminating a plurality of emission layers emitting lights having different colors. For example, a constitution where white light can be emitted by combining at least one yellow emission layer and at least one blue emission layer, a constitution where white light can be emitted by combining at least one cyan emission layer and at least one red emission layer, a constitution where white light can be emitted by combining at least one magenta emission layer and at least one green emission layer, and the like may be included.

A second electrode 730 is positioned on the pixel definition layer 190 and the organic emission layer 720.

The second electrode 730 becomes a cathode of the organic light emitting element. Accordingly, the first electrode 710, the organic emission layer 720, and the second electrode 730 form an organic light emitting element 70.

The organic light emitting display may have a structure of, for example, a top display type, a bottom display type, and a double-sided display type according to a direction of light emitted by the organic light emitting element 70.

Next, a sealing member 260 is positioned on the second electrode 730.

The sealing member 260 may be formed by alternately laminating one or more organic layers and one or more inorganic layers. The inorganic layer or the organic layer may be each provided in plural.

The organic layer is formed of a polymer, and may be a single layer or a laminated layer formed of any one of polyethylene terephthalate, polyimide, polycarbonate, epoxy, polyethylene, and polyacrylate. For example, the organic layer may be formed of polyacrylate, and may include a material obtained by polymerizing a monomer composition including a diacrylate-based monomer and a triacrylate-based monomer. A monoacrylate-based monomer may be further included in the monomer composition. Further, a photoinitiator such as TPO may be further included in the monomer composition, but the present example embodiment is not limited thereto.

The inorganic layer may be a single layer or a laminated layer including metal oxide or metal nitride. Specifically, the inorganic layer may include any one of $SiN_x$, $Al_2O_3$, $SiO_2$, and $TiO_2$.

The uppermost layer of the sealing layer, which is exposed to the outside, may be formed of the inorganic layer in order to prevent permeation of moisture to the organic light emitting element.

As described above, the organic light emitting display according to the present example embodiment may include the insulating layer, the passivation layer, the pixel definition layer and the like including the positive photosensitive siloxane resin composition.

The present specification describes the positive photosensitive siloxane resin composition being used in the organic light emitting display but the positive photosensitive siloxane resin composition is not limited thereto and may be used in various other display devices.

The positive photosensitive siloxane resin composition may be formed by the insulating layer having the pattern and the like through the following method.

First, the positive photosensitive siloxane resin composition according to an embodiment is applied on the substrate by spin coating, slit and spin coating, slit coating, or a roll coating method. Next, after drying is performed under a vacuum, the solvent is removed through pre-baking to form a coat layer. In this case, pre-baking may be performed at a temperature of about 100 to 120° C. for 1 to 3 minutes.

Then, a predetermined pattern is formed by radiating energy, for example, visible rays, ultraviolet rays, far-ultraviolet rays, electronic beams, or X-rays on the coat layer according to a previously prepared pattern, and developing the coat layer by a developing solution to remove an unwanted portion.

An alkali aqueous solution may be used as the developing solution, and, for example, the developing solution may be an aqueous solution of inorganic alkalis such as sodium hydroxide, potassium hydroxide, and sodium carbonate, primary amines such as ethylamine and n-propylamine, secondary amines such as diethylamine and n-propylamine, tertiary amines such as trimethylamine, methyldiethylamine, dimethylethylamine, and triethylamine, alcohol amines such as dimethylethanolamine, methyldiethanolamine, and triethanolamine, or quaternary ammonium salts such as tetramethylammonium hydroxide and tetraethylammonium hydroxide may be used.

In this case, the developing solution is used by dissolving an alkali compound in a concentration of about 0.1 to 5 parts by weight, and a water-soluble organic solvent such as methanol and ethanol and a surfactant may be further included.

Further, after developing is performed by the developing solution, washing is performed by ultra-pure water for about 30 to 90 seconds to remove an unwanted portion, and drying is performed to form the pattern. After light such as UV is radiated again on the formed pattern, the pattern may be subjected to heat treatment by using a heating device such as an oven at a temperature of about 150 to 400° C. for about 30 to 90 minutes to obtain a final pattern.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthetic Example 1 (Manufacturing of Siloxane-Based Copolymer A)

55 parts by weight of phenyltriethoxysilane, 20 parts by weight of tetraethoxysilane, and 25 parts by weight of methyltriethoxysilane as reactive silane were added to a flask having a cooling pipe and an agitator, 100 parts by weight of methanol was added as the solvent, the flask was flushed with nitrogen, and agitation was slowly performed.

50 parts by weight of ultra-pure water and 4 parts by weight of oxalic acid that was the catalyst were further added to the reaction solution, and then slowly agitated. After about 1 hour, the temperature of the reaction solution was increased to 60° C. and this temperature was maintained for 10 hours to perform polymerization, and the reaction solution was cooled back to room temperature to finish the reaction.

Next, rapid cooling to 0° C. or less was further performed to remove the supernatant liquid containing the unreacted monomer and the catalyst through precipitation of the reactant. Until the unreacted monomer and the catalyst were completely removed, methanol was further added and the purifying process was repeated.

After the purifying process, the residual alcohol-based solvent and residual moisture generated during the reaction were removed through vacuum drying. Finally, a) siloxane-based copolymer A having the polystyrene-converted weight average molecular weight Mw of 3000 was manufactured.

Synthetic Example 2 (Manufacturing of Siloxane-Based Copolymer B)

60 parts by weight of butyltrimethoxysilane and 40 parts by weight of tetramethoxysilane as reactive silane were added to the flask having the cooling pipe and the agitator, the flask was flushed with nitrogen, and agitation was slowly performed. 50 parts by weight of ultra-pure water and 2 parts by weight of oxalic acid that was the catalyst were further added to the reaction solution, and then slowly agitated. After about 1 hour, the temperature of the reaction solution was increased to 60° C. and this temperature was maintained for 10 hours to perform bulk polymerization, and the reaction solution was then cooled to room temperature to finish the reaction.

Rapid cooling to 0° C. or less was further performed to remove the supernatant liquid containing the unreacted monomer and the catalyst through precipitation of the reactant. Until the unreacted monomer and the catalyst were completely removed, methanol was further added and the purifying process was repeated.

After the purifying process, the residual alcohol-based solvent and residual moisture generated during the reaction were removed through vacuum drying. a) siloxane-based copolymer B having the polystyrene-converted weight average molecular weight Mw of 7000 was manufactured therethrough.

Synthetic Example 3 (Manufacturing of Siloxane-Based Copolymer C)

The same method as Synthetic Example 1 was performed, except that 30 parts by weight of n-butyltriethoxysilane, 50 parts by weight of tetramethoxysilane, and 20 parts by weight of 3-glycidoxypropyltriethoxysilane as reactive silane were added to the flask having the cooling pipe and the agitator in Synthetic Example 1. a) siloxane-based copolymer C having the polystyrene-converted weight average molecular weight Mw of 5000 was manufactured therethrough.

Synthetic Example 4 (Manufacturing of Siloxane-Based Polymer D)

The same method as Synthetic Example 2 was performed, except that 50 parts by weight of benzyltrimethoxysilane, 40 parts by weight of tetraacetoxysilane, and 10 parts by weight of 1-(p-hydroxy phenyl)propyltrimethoxysilane as reactive silane were added to the flask having the cooling pipe and the agitator in Synthetic Example 2. a) siloxane-based copolymer D having the polystyrene-converted weight average molecular weight Mw of 10000 was manufactured therethrough.

Synthetic Example 5 (Manufacturing of Siloxane-Based Copolymer E)

The same method as Synthetic Example 1 was performed, except that 50 parts by weight of tolyltriethoxysilane and 50 parts by weight of tetraethoxysilane as reactive silane were added to the flask having the cooling pipe and the agitator in Synthetic Example 1. a) siloxane-based copolymer E having the polystyrene-converted weight average molecular weight Mw of 6000 was manufactured therethrough.

Synthetic Example 6 (Manufacturing of Siloxane-Based Copolymer F)

The same method as Synthetic Example 1 was performed, except that 50 parts by weight of silyltriethoxysilane and 50 parts by weight of tetramethoxysilane as reactive silane were added to the flask having the cooling pipe and the agitator in Synthetic Example 1. a) siloxane-based copolymer F having the polystyrene-converted weight average molecular weight Mw of 5500 was manufactured therethrough.

Synthetic Example 7 (Manufacturing of Siloxane-Based Copolymer G)

The same method as Synthetic Example 2 was performed, except that 20 parts by weight of n-hexyltriethoxysilane and 80 parts by weight of tetraethoxysilane as reactive silane were added to the flask having the cooling pipe and the agitator in Synthetic Example 2. a) siloxane-based copolymer G having the polystyrene-converted weight average molecular weight Mw of 19000 was manufactured therethrough.

Synthetic Example 8 (Manufacturing of Siloxane-Based Copolymer H)

The same method as Synthetic Example 1 was performed, except that 30 parts by weight of phenyltriethoxysilane and 70 parts by weight of tetraethoxysilane as reactive silane were added to the flask having the cooling pipe and the agitator in Synthetic Example 1. a) siloxane-based copolymer H having the polystyrene-converted weight average molecular weight Mw of 14000 was manufactured therethrough.

Synthetic Example 9 (Manufacturing of Siloxane-Based Copolymer I)

The same method as Synthetic Example 1 was performed, except that 70 parts by weight of diphenyldimethoxysilane, 20 parts by weight of tetraethoxysilane, and 10 parts by weight of 3-isocyanatepropyltriethoxysilane as reactive silane were added to the flask having the cooling pipe and the agitator in Synthetic Example 1. a) siloxane-based copolymer I having the polystyrene-converted weight average molecular weight Mw of 2500 was manufactured therethrough.

Synthetic Example 10 (Manufacturing of 1,2-quinonediazide Compound A)

The 1,2-naphthoquinonediazide-5-sulfonic acid ester compound having the degree of esterification of 67% was manufactured by performing the condensation reaction of 1 mole phenol compound represented by the following Chemical Formula 6 and 2 mole 1,2-naphthoquinonediazide-5-sulfonic acid[chloride].

[Chemical Formula 6]

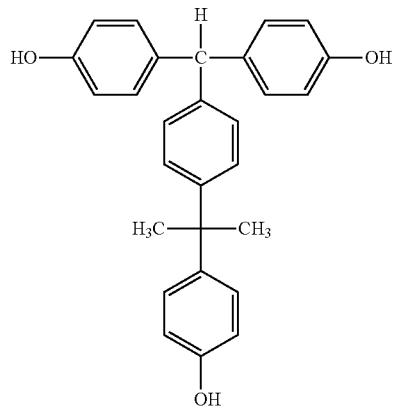

Synthetic Example 11 (Manufacturing of 1,2-quinonediazide Compound B)

The 1,2-naphthoquinonediazide-5-sulfonic acid ester compound having the degree of esterification of 80% was manufactured by performing the condensation reaction of 1 mole phenol compound represented by the following Chemical Formula 7 and 2 mole 1,2-naphthoquinonediazide-5-sulfonic acid[chloride].

[Chemical Formula 7]

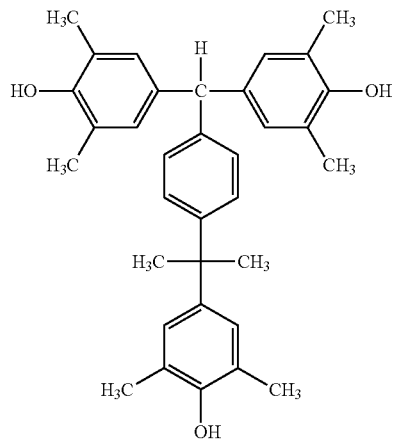

Comparative Synthetic Example 1 (Manufacturing of Siloxane-Based Copolymer J)

The same method as Synthetic Example 2 was performed, except that 10 parts by weight of silyltriethoxysilane and 90 parts by weight of tetraethoxysilane as reactive silane were added to the flask having the cooling pipe and the agitator in Synthetic Example 2. Siloxane-based copolymer J having the polystyrene-converted weight average molecular weight Mw of 25000 was manufactured therethrough.

Comparative Synthetic Example 2 (Manufacturing of Siloxane-Based Copolymer K)

The same method as Synthetic Example 1 was performed, except that 70 parts by weight of phenyltriethoxysilane and 30 parts by weight of n-hexyltrimethoxysilane as reactive silane were added to the flask having the cooling pipe and the agitator in Synthetic Example 1. Siloxane-based copolymer K having the polystyrene-converted weight average molecular weight Mw of 3000 was manufactured therethrough.

Comparative Synthetic Example 3 (Manufacturing of Siloxane-Based Copolymer L)

The same method as Synthetic Example 2 was performed, except that 90 parts by weight of butyltriethoxysilane and 10 parts by weight of tetraethoxysilane as reactive silane were added to the flask having the cooling pipe and the agitator in Synthetic Example 2. Siloxane-based copolymer L having the polystyrene-converted weight average molecular weight Mw of 1500 was manufactured therethrough.

Comparative Synthetic Example 4 (Manufacturing of Siloxane-Based Copolymer M)

The same method as Synthetic Example 2 was performed, except that after polymerization was finished, the supernatant liquid containing the unreacted monomer and the catalyst was not removed in Synthetic Example 2. Siloxane-based copolymer M having the polystyrene-converted weight average molecular weight Mw of 7000 was manufactured therethrough.

Comparative Synthetic Example 5 (Manufacturing of Aryl-Based Copolymer A)

The mixed solution of 400 parts by weight of tetrahydrofuran, 30 parts by weight of methacrylic acid, 30 parts by weight of styrene, and 40 parts by weight of glycidyl methacrylate was added to the flask having the cooler and the agitator. After the liquid composition was sufficiently mixed in the mixing vessel, 15 parts by weight of 2,2'-azobis(2,4-dimethylvaleronitrile) was further added.

The temperature of the polymerization mixing solution was slowly increased to 55° C., this temperature was maintained for 24 hours, the polymerization mixing solution was cooled to room temperature, and 500 ppm of hydrobenzophenone was added as the polymerization inhibitor to obtain the polymer solution having the solid concentration of 30 wt %.

Next, 100 parts by weight of the polymer solution was precipitated based on 1000 parts by weight of n-hexane in order to remove the unreacted monomers of the polymer solution. After precipitation, the solution where the unreacted material was dissolved was removed through the filtering process using the mesh. Thereafter, in order to remove the solvents containing the unreacted monomer remaining after the filtering process, vacuum drying was performed at 30° C. or less. Acryl-based copolymer A having the polystyrene-converted weight average molecular weight Mw of 8000 was manufactured therethrough.

Comparative Synthetic Example 6 (Manufacturing of Imide-Based Copolymer A)

70 parts by weight of gamma-butyrolactone, 100 parts by weight of 4,4'-diamino-3,3'-dimethyl-diphenylmethane that was diamine, and 100 parts by weight of 2,2-bis(3,4-anhydrodicarboxyphenyl)hexafluoropropane that was dianhydride were added to the reaction vessel in the flask having the cooler and the agitator, and reacted while agitated at room temperature for 1 hour. In order to finish the end reaction, 20 parts by weight of phthalic anhydride was further added, and then further reacted at room temperature for 1 hour, and the reaction was finished. Imide-based copolymer A having the polystyrene-converted weight average molecular weight Mw of 10000 was manufactured therethrough.

Example 1 (Manufacturing of Positive Photosensitive Siloxane Resin Composition)

100 parts by weight of siloxane-based copolymer A manufactured in Synthetic Example 1 and 25 parts by weight of 1,2-naphthoquinonediazide compound A manufactured in Synthetic Example 10 were added, mixed with propyleneglycolmethylether acetate to be dissolved so that the solid content was 25 parts by weight, and filtered by the millipore filter having the size of 0.1 μm to manufacture the positive photosensitive siloxane resin composition.

Example 2 (Manufacturing of Positive Photosensitive Siloxane Resin Composition)

The positive photosensitive siloxane resin composition was manufactured by the same method as Example 1, except that siloxane-based copolymer B of Synthetic Example 2 was used instead of siloxane-based copolymer A of Synthetic Example 1 in Example 1.

Example 3 (Manufacturing of Positive Photosensitive Siloxane Resin Composition)

The positive photosensitive siloxane resin composition was manufactured by the same method as Example 1, except that siloxane-based copolymer C of Synthetic Example 3 was used instead of siloxane-based copolymer A of Synthetic Example 1 in Example 1.

Example 4 (Manufacturing of Positive Photosensitive Siloxane Resin Composition)

The positive photosensitive siloxane resin composition was manufactured by the same method as Example 1, except that siloxane-based copolymer D of Synthetic Example 4 was used instead of siloxane-based copolymer A of Synthetic Example 1 in Example 1.

Example 5 (Manufacturing of Positive Photosensitive Siloxane Resin Composition)

The positive photosensitive siloxane resin composition was manufactured by the same method as Example 1, except that siloxane-based copolymer E of Synthetic Example 5 was used instead of siloxane-based copolymer A of Synthetic Example 1 in Example 1.

Example 6 (Manufacturing of Positive Photosensitive Siloxane Resin Composition)

The positive photosensitive siloxane resin composition was manufactured by the same method as Example 1, except that siloxane-based copolymer F of Synthetic Example 6 was used instead of siloxane-based copolymer A of Synthetic Example 1 in Example 1.

Example 7 (Manufacturing of Positive Photosensitive Siloxane Resin Composition)

The positive photosensitive siloxane resin composition was manufactured by the same method as Example 1, except that siloxane-based copolymer G of Synthetic Example 7 was used instead of siloxane-based copolymer A of Synthetic Example 1 in Example 1.

Example 8 (Manufacturing of Positive Photosensitive Siloxane Resin Composition)

The positive photosensitive siloxane resin composition was manufactured by the same method as Example 1, except that siloxane-based copolymer H of Synthetic Example 8 was used instead of siloxane-based copolymer A of Synthetic Example 1 in Example 1.

Example 9 (Manufacturing of Positive Photosensitive Siloxane Resin Composition)

The positive photosensitive siloxane resin composition was manufactured by the same method as Example 1, except that siloxane-based copolymer I of Synthetic Example 9 was used instead of siloxane-based copolymer A of Synthetic Example 1 in Example 1.

Example 10 (Manufacturing of Positive Photosensitive Siloxane Resin Composition))

The positive photosensitive siloxane resin composition was manufactured by the same method as Example 1, except that 1,2-naphthoquinonediazide-5-sulfonic acid ester compound B of Synthetic Example 11 was used instead of 1,2-naphthoquinonediazide-5-sulfonic acid ester compound A of Synthetic Example 10 in Example 1.

Example 11 (Manufacturing of Positive Photosensitive Siloxane Resin Composition)

The photosensitive resin composition was manufactured by the same method as
Example 1, except that when the photosensitive resin composition was manufactured, 5 parts by weight of 2-(3,4-epoxycyclohexyl)ethyltrimethoxysilane was further used as the silane coupling agent in Example 1.

Comparative Example 1 (Manufacturing of Positive Photosensitive Siloxane Resin Composition)

The positive photosensitive siloxane resin composition was manufactured by the same method as Example 1, except that siloxane-based copolymer J of Comparative Synthetic Example 1 was used instead of siloxane-based copolymer A of Synthetic Example 1 in Example 1.

Comparative Example 2 (Manufacturing of Positive Photosensitive Siloxane Resin Composition)

The positive photosensitive siloxane resin composition was manufactured by the same method as Example 1, except that siloxane-based copolymer K of Comparative Synthetic Example 2 was used instead of siloxane-based copolymer A of Synthetic Example 1 in Example 1.

Comparative Example 3 (Manufacturing of Positive Photosensitive Siloxane Resin Composition)

The positive photosensitive siloxane resin composition was manufactured by the same method as Example 1, except that siloxane-based copolymer L of Comparative Synthetic Example 3 was used instead of siloxane-based copolymer A of Synthetic Example 1 in Example 1.

Comparative Example 4 (Manufacturing of Positive Photosensitive Siloxane Resin Composition)

The positive photosensitive siloxane resin composition was manufactured by the same method as Example 1, except that siloxane-based copolymer M of Comparative Synthetic Example 4 was used instead of siloxane-based copolymer A of Synthetic Example 1 in Example 1.

Comparative Example 5 (Manufacturing of Positive Photosensitive Acryl Resin Composition)

The positive photosensitive acryl resin composition was manufactured by the same method as Example 1, except that acryl-based copolymer A of Comparative Synthetic Example 5 was used instead of siloxane-based copolymer A of Synthetic Example 1 in Example 1.

Comparative Example 6 (Manufacturing of Positive Photosensitive Polyimide Resin Composition)

The positive photosensitive polyimide resin composition was manufactured by the same method as Example 1, except that imide-based copolymer A of Comparative Synthetic Example 6 was used instead of siloxane-based copolymer A of Synthetic Example 1 in Example 1.

Physical properties such as sensitivity, resolution, adherence, transmittance, a heat resisting discoloration property, moisture absorptivity, and heat resistance of Examples 1 to 11 and Comparative Examples 1 to 6 as described above were measured, and are described in the following Table 1.

After the positive photosensitive siloxane resin compositions and the positive photosensitive acryl resin compositions manufactured in Examples 1 to 11 and Comparative Examples 1 to 5 were applied on the glass substrate by using the spin coater, vacuum drying was performed, followed by pre-baking on the hot plate at 100° C. for 2 minutes to form the layer having the thickness of 4.0 μm.

A) Sensitivity: After ultraviolet rays having the intensity of 20 mW/cm$^2$ were radiated in the radiation quantity for forming the contact hole having the size of 5 μm on the formed layer as described above by using the predetermined pattern mask, developing was performed by the 2.38 wt % tetramethylammoniumhydroxide aqueous solution at 23° C. for 1 minute, followed by washing by ultra-pure water for 1 minute.

Next, ultraviolet rays having the intensity of 20 mW/cm$^2$ were radiated in the quantity of 500 mJ/cm$^2$ on the developed pattern, and the pattern was cured in the oven at 230° C. for 60 minutes to obtain the pattern layer having the thickness of 3.5 μm and the contact hole size of 5 μm.

In this case, the radiation quantity for forming the contact hole having the size of 5 μm was measured.

B) Resolution: The minimum size of the contact hole formed when A) the sensitivity was measured was measured.

C) Adherence: The pattern layer was formed by the same method as when A) sensitivity was measured, and adherences according to the baking temperature were compared based on the case where the ratio of the line width of 10 μm and the slit width was 1:1. In this case, the case where adherence was secured at the pre-baking temperature of 90° C. to 100° C. was represented by ○, the case where adherence was secured at the pre-baking temperature of 105 to 115° C. was represented by Δ, and the case where adherence was secured at the pre-baking temperature of 120° C. or more or was not secured was represented by x.

D) Transmittance: Evaluation of transmittance was performed by measuring 400 nm transmittance of the pattern layer formed when A) sensitivity was measured by using the spectrophotometer. In this case, the case where transmittance was 90% or more was represented by ○, the case where transmittance was 85 to 90% was represented by Δ, the case where transmittance was less than 80% was represented by x.

E) Heat resisting discoloration property: When D) transmittance was evaluated, the measurement substrate was further cured in the oven at 300° C. for 60 minutes to evaluate the heat resisting discoloration property according to the change in 400 nm transmittance before and after curing. In this case, the case where the change rate was less than 5% was represented by ○, the case where the change rate was 5 to 10% was represented by Δ, and the case where the change rate was more than 10% was represented by x.

F) Moisture absorptivity: The weight change before and after the pattern layer formed by the same method as when A) sensitivity was measured was dipped in the constant temperature water bath at 25° C. for 24 hours was measured, and moisture absorptivity was evaluated therethrough. In this case, the case where the change rate was less than 0.1% was represented by ○, the case where the change rate was 0.1 to 0.5% was represented by Δ, and the case where the change rate was more than 0.5% was represented by x.

G) Heat resistance: Heat resistance was measured by using the TGA. After the pattern layer formed when A) sensitivity was measured was sampled, the temperature was increased from room temperature to 900° C. at 10° C./min by using the TGA. The case where the thermal decomposition temperature Td was 450° C. or more was represented by ○, the case where the thermal decomposition temperature Td was 350 to 400° C. was represented by Δ, and the case where the thermal decomposition temperature Td was less than 350° C. was represented by x.

TABLE 1

| Classification | Sensitivity (mJ/cm$^2$) | Resolution (um) | Adherence | Transmittance | Heat resisting discoloration property | Moisture absorptivity | Heat resistance |
|---|---|---|---|---|---|---|---|
| Example 1 | 70 | 2 | ○ | ○ | ○ | ○ | ○ |
| Example 2 | 75 | 2 | ○ | ○ | ○ | ○ | ○ |
| Example 3 | 70 | 2 | ○ | ○ | ○ | ○ | ○ |
| Example 4 | 70 | 2 | ○ | ○ | ○ | ○ | ○ |
| Example 5 | 75 | 2 | ○ | ○ | ○ | ○ | ○ |
| Example 6 | 75 | 2 | ○ | ○ | ○ | ○ | ○ |
| Example 7 | 75 | 2 | ○ | ○ | ○ | ○ | ○ |
| Example 8 | 75 | 2 | ○ | ○ | ○ | ○ | ○ |
| Example 9 | 70 | 2 | ○ | ○ | ○ | ○ | ○ |
| Example 10 | 80 | 2 | ○ | ○ | ○ | ○ | ○ |
| Example 11 | 75 | 2 | ○ | ○ | ○ | ○ | ○ |
| Comparative Example 1 | 140 | 3 | X | ○ | ○ | X | ○ |
| Comparative Example 2 | 135 | 3 | X | ○ | ○ | X | X |
| Comparative Example 3 | 125 | 3 | X | ○ | ○ | X | X |
| Comparative Example 4 | 80 | 3 | X | ○ | ○ | X | X |
| Comparative Example 5 | 140 | 3 | ○ | ○ | X | X | X |
| Comparative Example 6 | 150 | 3 | X | X | X | Δ | Δ |

Through Table 1, the positive photosensitive siloxane resin compositions manufactured in Examples 1 to 11 according to embodiments had excellent sensitivity as compared to Comparative Examples 1 to 3 and Comparative Examples 5 and 6, and had excellent resolution as compared to Comparative Examples 1 to 6. Further, the positive photosensitive siloxane resin composition had excellent adherence as compared to Comparative Examples 1 to 4 and Comparative Example 6, excellent transmittance as compared to Comparative Example 6, and excellent heat resisting discoloration property as compared to Comparative Examples 5 and 6. Particularly, as compared to Comparative Examples 1 to 6, the positive photosensitive siloxane resin composition could suppress outgassing and maintain low moisture absorptivity due to excellent heat resistance and thus secure improved reliability.

Through the aforementioned evaluation, it was confirmed that only the positive photosensitive siloxane resin compositions manufactured in Examples 1 to 11 were feasible as the material satisfying all of the aforementioned seven physical properties.

Next, the amounts of the unreacted monomer and the catalyst included in the positive photosensitive siloxane resin composition according to the example embodiment will be described. The amount of the unreacted monomer was measured through gas chromatography (GC), and the amount of the residual catalyst was measured through ion chromatography (IC).

A) Sensitivity—The case where the radiation quantity of the ultraviolet rays for forming the contact hole pattern having the size of 5 μm was 80 mJ or less was represented by ○, the case where the radiation quantity was 80 to 100 mJ was represented by Δ, and the case where the radiation quantity was more than 100 mJ was represented by x.

B) Resolution—The minimum size of the contact hole pattern formed when A) sensitivity was measured was measured. The case where the minimum size was 2 μm or less was represented by ○, and the case where the minimum size was 3 μm or more was represented by x.

C) Moisture absorptivity—The weight change before and after the pattern was dipped in the constant temperature water bath at 25° C. for 24 hours was measured to evaluate moisture absorptivity. In this case, the case where the change rate was less than 0.1% was represented by ○, the case where the change rate was 0.1 to 0.5% was represented by Δ, and the case where the change rate was more than 0.5% was represented by x.

TABLE 2

| Unreacted monomer | 8% | 8% | 7% | 9% | 5% | 4% | 7% | 3% |
|---|---|---|---|---|---|---|---|---|
| Catalyst | Hydrochloric acid 2000 ppm | Nitric acid 1450 ppm | Oxalic acid 1120 ppm | Acetic acid 1460 ppm | Hydrochloric acid 2200 ppm | Nitric acid 2360 ppm | Oxalic acid 2740 ppm | Acetic acid 2230 ppm |
| Sensitivity | 80 mJ | 75 mJ | 73 mJ | 72 mJ | 105 mJ | 115 mJ | 105 mJ | 112 mJ |
|  | ○ | ○ | ○ | ○ | X | X | X | X |
| Resolution | 2 μm | 2 μm | 2 μm | 2 μm | 3 μm | 4 μm | 3 μm | 3 μm |
|  | ○ | ○ | ○ | ○ | X | X | X | X |
| Moisture absorptivity | 0.09% | 0.08% | 0.08% | 0.06% | 0.13% | 0.27% | 0.17% | 0.23% |
|  | ○ | ○ | ○ | ○ | Δ | Δ | Δ | Δ |

TABLE 3

| Unreacted monomer | 10% | 12% | 15% | 13% | 15% | 11% | 13% | 14% |
|---|---|---|---|---|---|---|---|---|
| Catalyst | Hydrochloric acid 1250 ppm | Nitric acid 950 ppm | Oxalic acid 1340 ppm | Acetic acid 1215 ppm | Hydrochloric acid 3250 ppm | Nitric acid 950 ppm | Oxalic acid 1340 ppm | Acetic acid 1215 ppm |
| Sensitivity | 78 mJ ○ | 75 mJ ○ | 77 mJ ○ | 78 mJ ○ | 76 mJ ○ | 75 mJ ○ | 78 mJ ○ | 80 mJ ○ |
| Resolution | 2 μm ○ | 3 μm X | 4 μm X | 3 μm X | 4 μm X | 3 μm X | 3 μm X | 4 μm X |
| Moisture absorptivity | 0.05% ○ | 0.06% ○ | 0.07% ○ | 0.06% ○ | 0.57% X | 0.16% Δ | 0.21% Δ | 0.24% Δ |

According to Tables 2 and 3, in the Example where the content of the hydrochloric acid as the catalyst was 2200 ppm, the Example where the content of the nitric acid was 2360 ppm, the Example where the content of the oxalic acid was 2740 ppm, and the Example where the content of the acetic acid was 2230 ppm, physical properties relating to sensitivity and resolution were not suitable, and moisture absorptivity were relatively poor.

Further, in the Examples where the amount of the unreacted monomer was 10% or more, physical properties with respect to resolution or moisture absorptivity were relatively poor.

As seen in the Tables above, the positive photosensitive siloxane resin composition where the content of the unreacted monomer was 10% or less and the content of the catalyst was 2000 ppm or less could provide suitable sensitivity, resolution, and moisture absorptivity.

By way of summation and review, in order to insulate wires disposed between layers with each other in a liquid crystal display and an organic light emitting display and improve an opening ratio, a photosensitive organic insulating layer has been considered.

An acryl-based insulating layer may be used as an interlayer insulating layer for the liquid crystal display, but such a layer may exhibit outgassing due to deterioration in heat resistance. Further, a polyimide-based material may be used as an interlayer insulating layer or a pixel definition layer for the organic light emitting display, but such a material may exhibit relatively low sensitivity, adherence, transmittance, and may exhibit a heat resisting discoloration property, and the like. Therefore, a material suppressing outgassing and having low moisture absorptivity is desired.

As described above, embodiments may provide a positive photosensitive siloxane resin composition having excellent performance such as sensitivity, resolution, adherence, transmittance, and a heat resisting discoloration property, and suppressing outgassing and having low moisture absorptivity through excellent heat resistance. Further, embodiments may provide a display device having an insulating layer, a passivation layer, a planarization layer, a partition, a pixel definition layer, or the like formed from the positive photosensitive siloxane resin composition to improve reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A positive photosensitive siloxane resin composition, comprising:
   a) a siloxane copolymer obtained by performing hydrolysis and condensation polymerization of i) at least one reactive silane represented by the following Chemical Formula 1 and ii) at least one 4-functional reactive silane represented by the following Chemical Formula 2 under a catalyst, the copolymer having a polystyrene-converted weight average molecular weight Mw of 1,000 to 20,000;
   b) a 1,2-quinonediazide compound; and
   c) a solvent, $$(R_1)_n Si(R_2)_{4-n} \quad \text{[Chemical Formula 1]}$$

$$Si(R_3)_4 \quad \text{[Chemical Formula 2]}$$

wherein $R_1$s are each independently any one of an alkyl group having 1 to 10 carbon atoms and an aryl group having 6 to 15 carbon atoms, $R_2$ is an alkoxy group having 1 to 4 carbon atoms, phenoxy, or acetoxy, $R_3$s are each independently any one of an alkoxy group having 1 to 4 carbon atoms, phenoxy, or an acetoxy group, and n is a natural number of 1 to 3, and wherein the copolymer has an unreacted monomer content of 10% or less and a catalyst content of 2000 ppm or less.

2. The positive photosensitive siloxane resin composition as claimed in claim 1, wherein the copolymer includes a ladder structure, and the copolymer having the ladder structure is present in an amount of 30 wt % or more based on the weight of entire positive photosensitive siloxane resin composition.

3. The positive photosensitive siloxane resin composition as claimed in claim 1, wherein the siloxane-based copolymer is included in an amount of 100 parts by weight, the 1,2-quinonediazide compound is included in an amount of 5 to 50 parts by weight, and a solid content of the solvent is 10 to 50 wt %.

4. The positive photosensitive siloxane resin composition as claimed in claim 1, wherein the copolymer is obtained by performing hydrolysis and condensation polymerization of i) 20 to 80 parts by weight of the reactive silane represented by Chemical Formula 1 and ii) 20 to 80 parts by weight of the 4-functional reactive silane represented by Chemical Formula 2.

5. The positive photosensitive siloxane resin composition as claimed in claim 1, wherein the copolymer is obtained by performing hydrolysis and condensation of i) at least one reactive silane represented by Chemical Formula 1, ii) at least one 4-functional reactive silane represented by Chemical Formula 2, and iii) 5 to 50 parts by weight of reactive silane represented by the following Chemical Formula 3:

  [Chemical Formula 3]

wherein $R_4$s are each independently vinyl, 3-acryloxyalkyl, 3-methacryloxyalkyl, 1-(p-hydroxyphenyl)alkyl, 2-(p-hydroxyphenyl)alkyl, 3-glycidoxyalkyl, 2-(3,4-epoxycyclohexyl)alkyl, 3-isocyanatealkyl, or oxethanealkyl, $R_5$ is an alkoxy group having 1 to 4 carbon atoms, phenoxy, or acetoxy, and n is a natural number of 1 to 3.

6. The positive photosensitive siloxane resin composition as claimed in claim 1, wherein the 1,2-quinonediazide compound includes at least one of 1,2-quinonediazide 4-sulfonic acid ester, 1,2-quinonediazide 5-sulfonic acid ester, and 1,2-quinonediazide 6-sulfonic acid ester.

7. The positive photosensitive siloxane resin composition as claimed in claim 1, wherein the solvent includes at least one of propyleneglycolmethylether acetate, propyleneglycolethylether acetate, propyleneglycolpropylether acetate, propyleneglycolmethylether propionate, propyleneglycolethylether propionate, propyleneglycolpropylether propionate, propyleneglycolmethylether, propyleneglycolethylether, propyleneglycolpropylether, propyleneglycolbutylether, diethyleneglycoldiethylether, diethyleneglycolmethylethylether, dipropyleneglycoldimethylether, dibutyleneglycoldimethylether, dibutyleneglycoldiethylether, diethyleneglycolbutylmethylether, diethyleneglycolbutylethylether, triethyleneglycoldimethylether, triethyleneglycolbutylmethylether, diethyleneglycoltertiarybutyl ether, tetraethyleneglycoldimethylether, dipropyleneglycoldiethylether, diethyleneglycolethylhexylether, diethyleneglycolmethylhexylether, dipropyleneglycolbutylmethylether, dipropyleneglycolethylhexylether, and dipropyleneglycolmethylhexylether.

8. The positive photosensitive siloxane resin composition as claimed in claim 1, further comprising:
d) 1 to 20 parts by weight of a silane coupling agent represented by the following Chemical Formula 4:

  [Chemical Formula 4]

$R_6$s are each independently 1-(p-hydroxyphenyl)alkyl, 2-(p-hydroxyphenyl)alkyl, 3-glycidoxyalkyl, 2-(3,4-epoxycyclohexyl)alkyl, 3-oxethanealkyl, or 3-isocyanatealkyl, $R_7$ is an alkoxy group having 1 to 4 carbon atoms, phenoxy, or acetoxy, and n is a natural number of 1 to 3.

9. A method of manufacturing a positive photosensitive siloxane resin composition, the method comprising:
forming a) a siloxane copolymer by performing hydrolysis and condensation polymerization of i) at least one reactive silane represented by the following Chemical Formula 1 and ii) at least one 4-functional reactive silane represented by the following Chemical Formula 2 under a catalyst, and performing filtering to remove an unreacted monomer and the catalyst with respect to the copolymer, wherein a polystyrene-converted weight average molecular weight Mw of the copolymer is 1,000 to 20,000, and
combining the a) copolymer with b) a 1,2-quinonediazide compound, and c) a solvent,

  [Chemical Formula 1]

  [Chemical Formula 2]

wherein $R_1$ s are each independently any one of an alkyl group having 1 to 10 carbon atoms and an aryl group having 6 to 15 carbon atoms, $R_2$ is an alkoxy group having 1 to 4 carbon atoms, phenoxy, or acetoxy, $R_3$s are each independently any one of an alkoxy group having 1 to 4 carbon atoms, phenoxy, or an acetoxy group, and n is a natural number of 1 to 3.

10. The method as claimed in claim 9, wherein the filtering is repeated so that an unreacted monomer content is 10% or less and a catalyst content is 2000 ppm or less.

11. The method as claimed in claim 9, wherein the copolymer includes a ladder structure, and the copolymer having the ladder structure is present in an amount of 30 wt % or more based on the entire positive photosensitive siloxane resin composition.

12. The method as claimed in claim 9, wherein the copolymer is included in an amount of 100 parts by weight, the 1,2-quinonediazide compound is included in an amount of 5 to 50 parts by weight, and a solid content of the solvent is 10 to 50 wt %.

13. The method as claimed in claim 9, wherein the copolymer is obtained by performing hydrolysis and condensation polymerization of i) 20 to 80 parts by weight of the reactive silane represented by Chemical Formula 1 and ii) 20 to 80 parts by weight of the 4-functional reactive silane represented by Chemical Formula 2.

14. The method as claimed in claim 9, wherein the copolymer is obtained by performing hydrolysis and condensation of i) at least one reactive silane represented by Chemical Formula 1, ii) at least one 4-functional reactive silane represented by Chemical Formula 2, and iii) 5 to 50 parts by weight of reactive silane represented by the following Chemical Formula 3:

  [Chemical Formula 3]

wherein $R_4$s are each independently vinyl, 3-acryloxyalkyl, 3-methacryloxyalkyl, 1-(p-hydroxyphenyl)alkyl, 2-(p-hydroxyphenyl)alkyl, 3-glycidoxyalkyl, 2-(3,4-epoxycyclohexyl)alkyl, 3-isocyanatealkyl, or oxethanealkyl, $R_5$ is an alkoxy group having 1 to 4 carbon atoms, phenoxy, or acetoxy, and n is a natural number of 1 to 3.

15. The method as claimed in claim 9, wherein the a) copolymer with b) a 1,2-quinonediazide compound, and c) a solvent are combined with d) 1 to 20 parts by weight of a silane coupling agent represented by the following Chemical Formula 4:

  [Chemical Formula 4]

wherein $R_6$s are each independently 1-(p-hydroxyphenyl)alkyl, 2-(p-hydroxyphenyl)alkyl, 3-glycidoxyalkyl, 2-(3,4-epoxycyclohexyl)alkyl, 3-oxethanealkyl, or 3-isocyanatealkyl, $R_7$ is an alkoxy group having 1 to 4 carbon atoms, phenoxy, or acetoxy, and n is a natural number of 1 to 3.

16. An organic light emitting display, comprising:
an insulating substrate,
a thin film transistor positioned on the insulating substrate,
a first electrode connected to the thin film transistor,
a pixel definition layer positioned on the first electrode and partially exposing the first electrode,
an organic emission layer positioned on the pixel definition layer, and
a second electrode positioned on the organic emission layer,
wherein the pixel definition layer is formed from a composition that includes:

a) a siloxane copolymer obtained by performing hydrolysis and condensation polymerization of i) at least one reactive silane represented by the following Chemical Formula 1 and ii) at least one 4-functional reactive silane represented by the following Chemical Formula 2 under a catalyst, the copolymer having a polystyrene-converted weight average molecular weight Mw of 1,000 to 20,000;

b) a 1,2-quinonediazide compound; and c) a solvent, $(R_1)_nSi(R_2)_{4-n}$ [Chemical Formula 1]

$Si(R_3)_4$ [Chemical Formula 2]

wherein $R_1$s are each independently any one of an alkyl group having 1 to 10 carbon atoms and an aryl group having 6 to 15 carbon atoms, $R_2$ is an alkoxy group having 1 to 4 carbon atoms, phenoxy, or acetoxy, $R_3$s are each independently any one of an alkoxy group having 1 to 4 carbon atoms, phenoxy, or an acetoxy group, and n is a natural number of 1 to 3.

17. The organic light emitting display as claimed in claim 16, wherein the copolymer has an unreacted monomer content of 10% or less and a catalyst content of 2000 ppm or less.

18. The organic light emitting display as claimed in claim 16, wherein, in the composition, the copolymer is included in an amount of 100 parts by weight, the 1,2-quinonediazide compound is included in an amount of 5 to 50 parts by weight, and a solid content of the solvent is 10 to 50 wt %.

19. The organic light emitting display as claimed in claim 16, wherein the siloxane-based copolymer is obtained by performing hydrolysis and condensation polymerization of i) 20 to 80 parts by weight of the reactive silane represented by Chemical Formula 1 and ii) 20 to 80 parts by weight of the 4-functional reactive silane represented by Chemical Formula 2.

20. The organic light emitting display as claimed in claim 16, wherein the copolymer is obtained by performing hydrolysis and condensation of i) at least one reactive silane represented by Chemical Formula 1, ii) at least one 4-functional reactive silane represented by Chemical Formula 2, and iii) 5 to 50 parts by weight of reactive silane represented by the following Chemical Formula 3:

$(R_4)_nSi(R_5)_{4-n}$ [Chemical Formula 3]

wherein $R_4$s are each independently vinyl, 3-acryloxyalkyl, 3-methacryloxyalkyl, 1-(p-hydroxyphenyl)alkyl, 2-(p-hydroxyphenyl)alkyl, 3-glycidoxyalkyl, 2-(3,4-epoxycyclohexyl)alkyl, 3-isocyanatealkyl, or oxethanealkyl, $R_5$ is an alkoxy group having 1 to 4 carbon atoms, phenoxy, or acetoxy, and n is a natural number of 1 to 3.

21. The organic light emitting display as claimed in claim 16, wherein the composition further includes d) 1 to 20 parts by weight of a silane coupling agent represented by the following Chemical Formula 4:

$(R_6)_nSi(R_7)_{4-n}$ [Chemical Formula 4]

wherein $R_6$s are each independently 1-(p-hydroxyphenyl)alkyl, 2-(p-hydroxyphenyl)alkyl, 3-glycidoxyalkyl, 2-(3,4-epoxycyclohexyl)alkyl, 3-oxethanealkyl, or 3-isocyanatealkyl, $R_7$ is an alkoxy group having 1 to 4 carbon atoms, phenoxy, or acetoxy, and n is a natural number of 1 to 3.

* * * * *